(12) United States Patent
Kimoto et al.

(10) Patent No.: US 8,457,169 B2
(45) Date of Patent: Jun. 4, 2013

(54) INTEGRATED SEMICONDUCTOR LASER ELEMENT, SEMICONDUCTOR LASER MODULE, AND OPTICAL TRANSMISSION SYSTEM

(75) Inventors: Tatsuya Kimoto, Tokyo (JP); Toshikazu Mukaihara, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/360,851

(22) Filed: Jan. 30, 2012

(65) Prior Publication Data

US 2012/0128375 A1     May 24, 2012

Related U.S. Application Data

(63) Continuation of application No. PCT/JP2010/061396, filed on Jul. 5, 2010.

(30) Foreign Application Priority Data

Jul. 30, 2009 (JP) ................................. 2009-178077

(51) Int. Cl.
*H01S 5/00*     (2006.01)

(52) U.S. Cl.
USPC ..................... 372/50.12; 372/50.1; 372/50.22

(58) Field of Classification Search
USPC ............... 372/50.1–50.23; 398/201; 359/333, 359/344
See application file for complete search history.

(56) References Cited

U.S. PATENT DOCUMENTS

| | | | |
|---|---|---|---|
| 5,003,550 A * | 3/1991 | Welch et al. ................ | 372/50.22 |
| 5,228,049 A * | 7/1993 | Paoli ........................... | 372/50.22 |
| 6,014,396 A * | 1/2000 | Osinski et al. ............. | 372/50.23 |
| 6,075,801 A * | 6/2000 | Tamanuki et al. ......... | 372/46.01 |
| 6,219,366 B1 | 4/2001 | Furushima | |

(Continued)

FOREIGN PATENT DOCUMENTS

| | | |
|---|---|---|
| JP | 09-288287 | 11/1997 |
| JP | 10-308556 | 11/1998 |

(Continued)

OTHER PUBLICATIONS

D.A. May-Arrioja, "Tunable multimode interference coupler" The institution of engineering and technology Apr. 14, 2007, Electronics Letters online No. 20071070, pp. 1-2.*

(Continued)

*Primary Examiner* — Jessica Stultz
*Assistant Examiner* — Delma R Forde
(74) *Attorney, Agent, or Firm* — Oblon, Spivak, McClelland, Maier & Neustadt, L.L.P.

(57) ABSTRACT

An integrated semiconductor laser element includes: semiconductor lasers that oscillate at different oscillation wavelengths from one another, each laser oscillating in a single mode; an optical coupler; and a semiconductor optical amplifier. At least one of active layers of the semiconductor lasers and an active layer of the semiconductor optical amplifier have a same thickness and a same composition that is set to have a gain peak wavelength near a center of a wavelength band formed by the oscillation wavelengths. The semiconductor optical amplifier includes: an equal width portion formed on a side of the optical coupler to guide light in a single mode; and an expanded width portion formed on a light output side. The width of the expanded width portion is set according to a total thickness of well layers of the active layer of the semiconductor optical amplifier.

14 Claims, 8 Drawing Sheets

U.S. PATENT DOCUMENTS

| | | | |
|---|---|---|---|
| 6,768,758 B1 * | 7/2004 | Hamamoto | 372/50.22 |
| 6,777,768 B2 * | 8/2004 | Goldstein et al. | 257/432 |
| 6,813,068 B2 * | 11/2004 | Hamamoto | 359/344 |
| 7,184,207 B1 * | 2/2007 | Walker et al. | 359/344 |
| 7,366,220 B2 * | 4/2008 | Takabayashi | 372/102 |
| 7,633,984 B2 * | 12/2009 | Hayakawa et al. | 372/50.11 |
| 2001/0010701 A1 | 8/2001 | Furushima | |
| 2003/0210724 A1 * | 11/2003 | Ungar | 372/50 |
| 2003/0219054 A1 * | 11/2003 | Capasso et al. | 372/50 |
| 2004/0125846 A1 * | 7/2004 | Zediker et al. | 372/50 |
| 2010/0284019 A1 * | 11/2010 | Fukuda | 356/477 |
| 2012/0027041 A1 * | 2/2012 | Yamazaki | 372/50.12 |

FOREIGN PATENT DOCUMENTS

| | | |
|---|---|---|
| JP | 11-074604 | 3/1999 |
| JP | 2003-014963 | 1/2003 |
| JP | 2003-258368 | 9/2003 |
| JP | 2007-194340 | 8/2007 |
| JP | 2007-250889 A | 9/2007 |
| WO | 03/077383 | 9/2003 |
| WO | 2011/013480 | 2/2011 |

OTHER PUBLICATIONS

JP2003-258368 Machine translation, Dec. 9, 2003, pp. 1-24.*
S. Balsamo et al. "High-Power 980-nm Pump Lasers With Flared Waveguide Design" Journal of Lightwave Technology, vol. 20, No. 8, Aug. 2002. pp. 1512-1516.*
Google inventos search.*
Module definition by Merriam-Webster, Sep. 13, 20012, pp. 1-3.*
Tatsuya Kimoto et al. "Reduction of Spectral-Linewidth in High Power SOA Integrated Wavelength Selectable Laser", IEEE Journal of Selected Topics in Quantum Electronics, vol. 11, No. 5, Sep./Oct. 2005, pp. 919-923.*
D.F. Welch et al "High poser, AlGaAs buried heterostructure lasers with flared waveguides" Appl. Phys. Lett. 50, 233 (1987); pp. 233-235.*
JP2007-250889 machine translation.*
Chinese Office Action dated Dec. 3, 2012.

* cited by examiner

INTEGRATED SEMICONDUCTOR LASER ELEMENT, SEMICONDUCTOR LASER MODULE, AND OPTICAL TRANSMISSION SYSTEM

CROSS-REFERENCE TO RELATED APPLICATIONS

This application is a continuation of PCT International Application No. PCT/JP2010/061396 filed on Jul. 5, 2010 which claims the benefit of priority from Japanese Patent Application No. 2009-178077 filed on Jul. 30, 2009, the entire contents of which are incorporated herein by reference.

BACKGROUND OF THE INVENTION

1. Field of the Invention

The present invention relates to an integrated semiconductor laser element having a plurality of semiconductor lasers integrated therein, a semiconductor laser module using the same, and an optical transmission system.

2. Description of the Related Art

Figure 15:
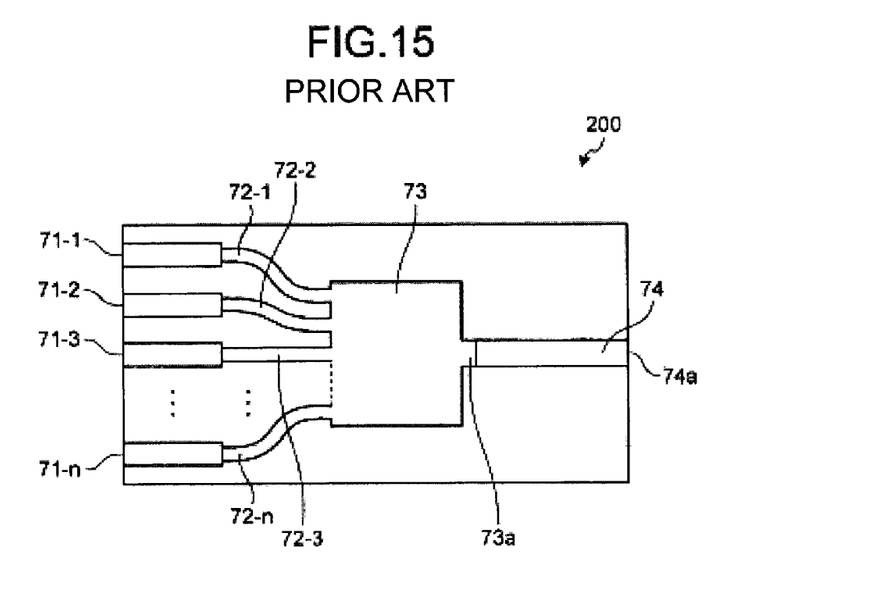
FIG. 15 is a schematic plan view of an integrated semiconductor laser element having a conventional structure.

As a wavelength-tunable laser for DWDM (Dense Wavelength Division Multiplexing) optical communications, for example, an integrated semiconductor laser element has been disclosed (see, for example, Japanese Patent Application Laid-open 2003-258368). FIG. 15 is a schematic plan view of an integrated semiconductor laser element having a conventional structure. An integrated semiconductor laser element 200 includes a plurality of DFB (Distributed Feedback) lasers 71-1 to 71-*n* (n is an integer equal to or larger than 2) which have different oscillation wavelengths from one another, a plurality of optical waveguides 72-1 to 72-*n*, an optical coupler 73, and a semiconductor optical amplifier 74, where all the elements are monolithically integrated on a same substrate.

An operation of the integrated semiconductor laser element 200 is explained. First, a DFB laser selected from the DFB lasers 71-1 to 71-*n* is driven. An optical waveguide optically coupled to the driven DFB laser from the DFB lasers 71-1 to 71-*n* guides a laser light output from the driven DFB laser. The optical coupler 73 transmits the laser light guided by the optical waveguide, and outputs the guided laser light from an output port 73*a*. The semiconductor optical amplifier 74 amplifies the laser light output from the output port 73*a*, and outputs an amplified laser light from an output end 74*a*.

The above-mentioned integrated semiconductor laser element is used as an optical transmitter in combination with an external modulator, for example, for a long-haul optical transmission in a DWDM optical communication network system.

In recent years, in order to broaden the transmission bandwidth, the symbol rate has been increased, for example, from 10 gigabits per second to 40 gigabits per second. Therefore, in order to prevent a decrease of the optical energy per symbol, there is a need for a higher-power integrated semiconductor laser element. Similarly, in order to broaden the transmission bandwidth, the modulation system has been multivalued from OOK, PSK, and the like to QPSK, 8PSK, and 16QAM. Due to such a multivalued system, a loss of the external modulator is increased, and therefore, in order to compensate for the increased loss, there is a need for a higher-power integrated semiconductor laser element.

Furthermore, in the DWDM optical communication network system, a large number of wavelength-tunable lasers are used, and therefore it is desirable that each of the wavelength-tunable lasers has low power consumption. Particularly, because a power used for cooling a device takes a large portion in the whole power consumption in the wavelength-tunable laser, in order to suppress the power consumption, it is desirable to use a wavelength-tunable laser that can operate in a high temperature condition.

However, if an even higher-power output is achieved in the conventional integrated semiconductor laser element with a simultaneously-layered structure on the same substrate, the wavelength dependency of the output intensity of the laser light changes, thereby increasing a deviation of the output intensity with respect to the wavelength.

SUMMARY OF THE INVENTION

It is an object of the present invention to provide a high-power integrated semiconductor laser element which is suitable for an operation in a high temperature condition and in which an increase in a deviation of the output intensity with respect to a wavelength is suppressed, a semiconductor laser module using the integrated semiconductor laser element, and an optical transmission system.

According to one aspect of the present invention, there is provided an integrated semiconductor laser element including: a plurality of semiconductor lasers that oscillate at different oscillation wavelengths from one another, each of the semiconductor laser oscillating in a single mode; an optical coupler that couples output light from the semiconductor lasers; and a semiconductor optical amplifier that amplifies output light from the optical coupler, wherein at least one of active layers of the semiconductor lasers and an active layer of the semiconductor optical amplifier have a same thickness and a same composition that is set to have a gain peak wavelength near a center of a wavelength band formed by the oscillation wavelengths of the semiconductor lasers, the semiconductor optical amplifier includes an equal width portion formed on a side of the optical coupler to guide the output light in a single mode and an expanded width portion which is formed on a light output side and has a width wider than a width of the equal width portion, and when operating in an operating state where a gain peak wavelength of the semiconductor optical amplifier shifts from a gain peak obtained by setting the composition to a side of a short wavelength due to a band filling phenomenon if the width of the expanded width portion is the same as the width of the equal width portion, the width of the expanded width portion is set according to a total thickness of well layers of the active layer of the semiconductor optical amplifier such that total volume of the well layers of the active layer of the semiconductor optical amplifier is increased to a level that suppresses the band filling phenomenon in order to substantially match the gain peak wavelength in the operating state and the gain peak wavelength of the semiconductor lasers which is obtained by setting the composition.

According to another aspect of the present invention, there is provided a semiconductor laser module including the integrated semiconductor laser element.

According to still another aspect of the present invention, there is provided an optical transmission system including the semiconductor laser module, wherein a data rate of 100 Gbps is achieved.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of an integrated semiconductor laser element according to the present invention will be explained below in detail with reference to the accompanying drawings. The present invention is not limited to the embodiments. In the drawings, the same reference signs are given to the same or corresponding elements.

First Embodiment

Figure 1:
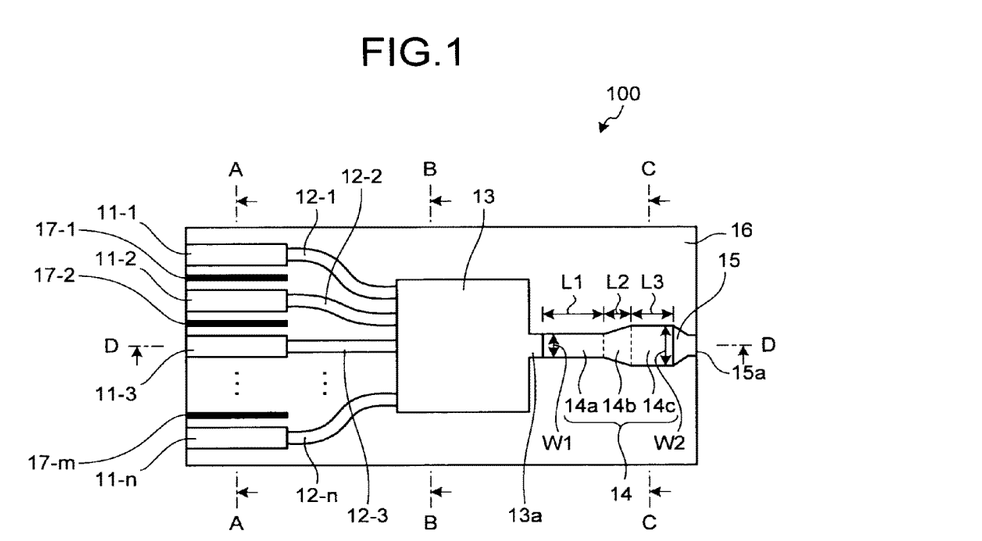
FIG. 1 is a schematic plan view of an integrated semiconductor laser element according to a first embodiment of the present invention.

First, an integrated semiconductor laser element according to a first embodiment of the present invention is explained. FIG. 1 is a schematic plan view of the integrated semiconductor laser element according to the first embodiment.

As shown in FIG. 1, an integrated semiconductor laser element 100 according to the first embodiment includes a plurality of DFB lasers 11-1 to 11-$n$ (n is an integer equal to or larger than 2) each having a mesa structure, a plurality of optical waveguides 12-1 to 12-$n$, an optical coupler 13, a semiconductor optical amplifier 14, and a spot size converter 15, constituting a structure in which all these constituent elements are integrated on a single semiconductor substrate and then embedded by an embedding portion 16. Furthermore, in the embedding portion 16 between the DFB lasers 11-1 to 11-$n$, trench grooves 17-1 to 17-$m$ (m=n−1) are provided. An outline of each of the constituent elements, such as the DFB lasers 11-1 to 11-$n$ shown in FIG. 1, indicates an outline of a mesa structure in each of the constituent elements.

Each of the DFB lasers 11-1 to 11-$n$ is an edge emitting laser having a buried structure in a stripe shape with a width of 1.5 μm to 3 μm and length of 600 μm, and the DFB lasers 11-1 to 11-$n$ are formed with a pitch of 25 μm at one end portion of the integrated semiconductor laser element 100 in its width direction. The DFB lasers 11-1 to 11-$n$ are configured such that grating spaces of diffraction gratings of the DFB lasers 11-1 to 11-$n$ are different from each other so that output light from each of the DFB lasers 11-1 to 11-$n$ is laser light oscillated in a single mode, and oscillation wavelengths are different from each other in a range from 1530 nm to 1570 nm. Furthermore, the oscillation wavelengths of the DFB lasers 11-1 to 11-$n$ can be fine-tuned by changing a set temperature of the integrated semiconductor laser element 100. That is, the integrated semiconductor laser element 100 achieves a broad wavelength tuning range by switching the DFB lasers to drive and performing temperature control.

Figure 2:
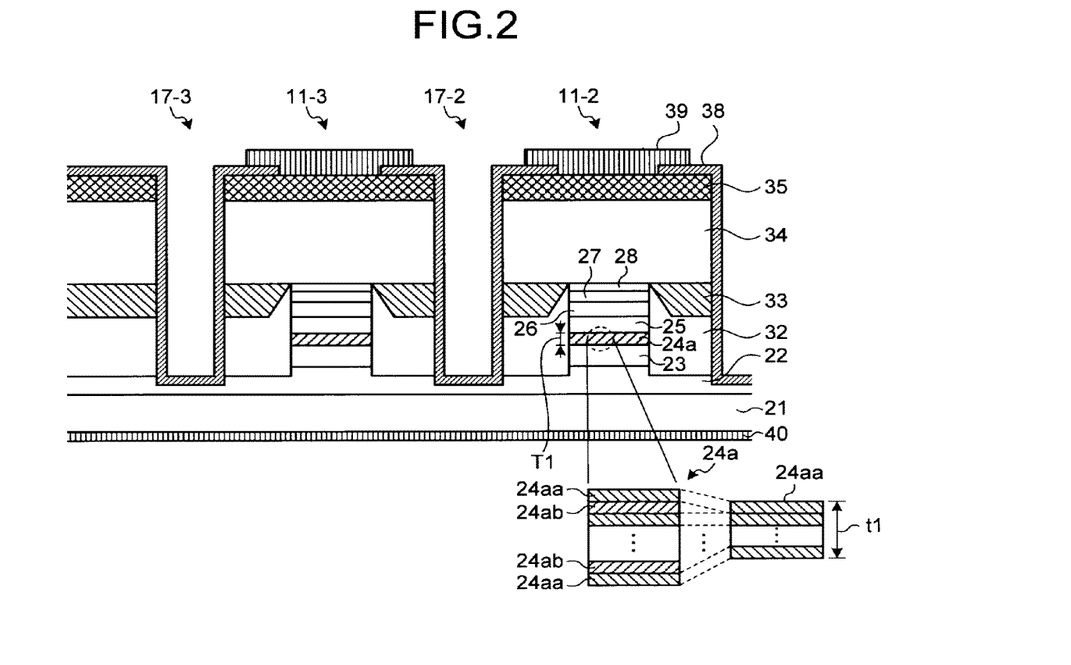
FIG. 2 depicts a part of a cross section of the integrated semiconductor laser element cut along a line A-A shown in FIG. 1.

FIG. 2 depicts a part of a cross section of the integrated semiconductor laser element 100 cut along a line A-A shown in FIG. 1. In FIG. 2, a portion of an active layer in the cross section cut along the line A-A is shown, indicating its layered structure. As shown in FIG. 2, for example, the DFB laser 11-2 includes an n-type InP buffer layer 22 that also serves as a lower cladding layer, a lower InGaAsP-SCH (Separate Confinement Heterostructure) layer 23 in which a composition is changed in a continuous manner, an active layer 24$a$ having an MQW (Multi-Quantum Well) structure, an upper InGaAsP-SCH layer 25, an InP spacer layer 26, a grating layer 27 formed of InGaAsP or AlGaInAs, and a p-type InP layer 28, which are sequentially grown on an n-type InP substrate 21. The layers from the p-type InP layer 28 to the n-type InP buffer layer 22 form a mesa structure, and this mesa structure is embedded by a p-type InP embedding layer 32 and an n-type InP current blocking layer 33. Furthermore, a p-type InP cladding layer 34 and an InGaAs contact layer 35 are sequentially grown on the p-type InP layer 28 and the n-type InP current blocking layer 33. Moreover, an outer surface of each of the semiconductor layers is covered by a SiN protective film 38. A part of the SiN protective film 38 is opened to form an opening on the InGaAs contact layer 35, and a p-side electrode 39 is formed on the opening. In addition, an n-side electrode 40 is formed on a rear surface of the n-type InP substrate 21.

The active layer 24$a$ has a thickness T1, and as shown in an enlarged cross section, includes a plurality of well layers 24$aa$ and a plurality of barrier layers 24$ab$ grown in an alternate manner. Both of the well layers 24$aa$ and the barrier layers 24$ab$ are formed of a GaInAsP-based semiconductor material or an AlGaInAs-based semiconductor material. The thickness T1 is a total thickness of the active layer 24$a$ including the well layers 24$aa$ and the barrier layers 24$ab$, and a thickness t1 is a total thickness of the well layers 24$aa$ only. The composition of the active layer 24$a$ is set to have a gain peak wavelength near a center of a wavelength band between 1530 nm and 1570 nm, which is formed by the oscillation wavelengths of the DFB lasers 11-1 to 11-*n*, that is, near 1550 nm. The gain peak wavelength of the semiconductor laser with this composition setting is the value at a temperature range from 10° C. to 50° C., which is an operation temperature range of the integrated semiconductor laser element 100. The other DFB lasers 11-1, 11-3 to 11-*n* have substantially the same structure as the DFB laser 11-2 including the composition and the thickness of the active layer.

Figure 3:
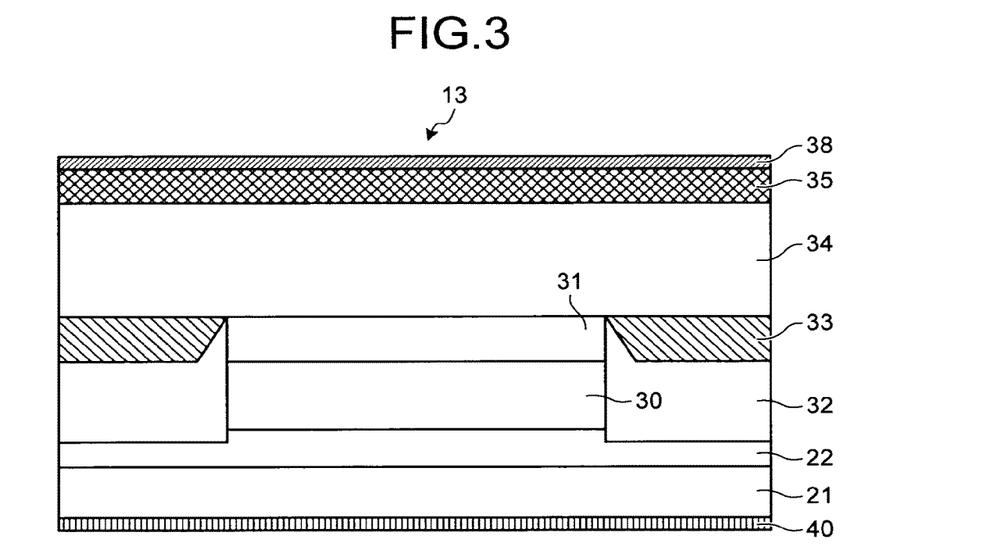
FIG. 3 is a cross-sectional view of the integrated semiconductor laser element cut along a line B-B shown in FIG. 1.

The optical coupler 13 is formed near a center of the integrated semiconductor laser element 100. FIG. 3 is a cross-sectional view of the integrated semiconductor laser element 100 cut along a line B-B shown in FIG. 1. As shown in FIG. 3, the optical coupler 13 has a similar buried mesa structure as the DFB lasers 11-1 to 11-*n*. However, the optical coupler 13 includes a structure in which a layered structure from the lower InGaAsP-SCH layer 23 to the p-type InP layer 28 is replaced with a layered structure of an InGaAsP core layer 30 and an i-type InP layer 31, and a mesa width is formed wider. Furthermore, the opening of the SiN protective film 38 and the p-side electrode 39 are not formed in the optical coupler 13.

The optical waveguides 12-1 to 12-*n* are formed between the DFB lasers 11-1 to 11-*n* and the optical coupler 13, having the same buried mesa structure as the optical coupler 13, and optically couples the DFB lasers 11-1 to 11-*n* and the optical coupler 13.

The semiconductor optical amplifier 14 is formed on the other side of the DFB lasers 11-1 to 11-*n* across the optical coupler 13. As shown in FIG. 1, the semiconductor optical amplifier 14 includes an equal width portion 14*a* positioned on the side of the optical coupler 13, an expanded width portion 14*c* of the equal width positioned on the more light output side than the equal width portion 14*a*, and a tapered portion 14*b* that connects the equal width portion 14*a* and the expanded width portion 14*c*. The equal width portion 14*a*, the tapered portion 14*b*, and the expanded width portion 14*c* have a length L1, a length L2, and a length L3, respectively. As for the width of the semiconductor optical amplifier 14, the equal width portion 14*a* has a width W1, the expanded width portion 14*c* has a width W2 that is wider than the width W1, and the tapered portion 14*b* has a width that is expanded from a value of the width W1 to a value of the width W2 in a continuous manner.

Figure 4:
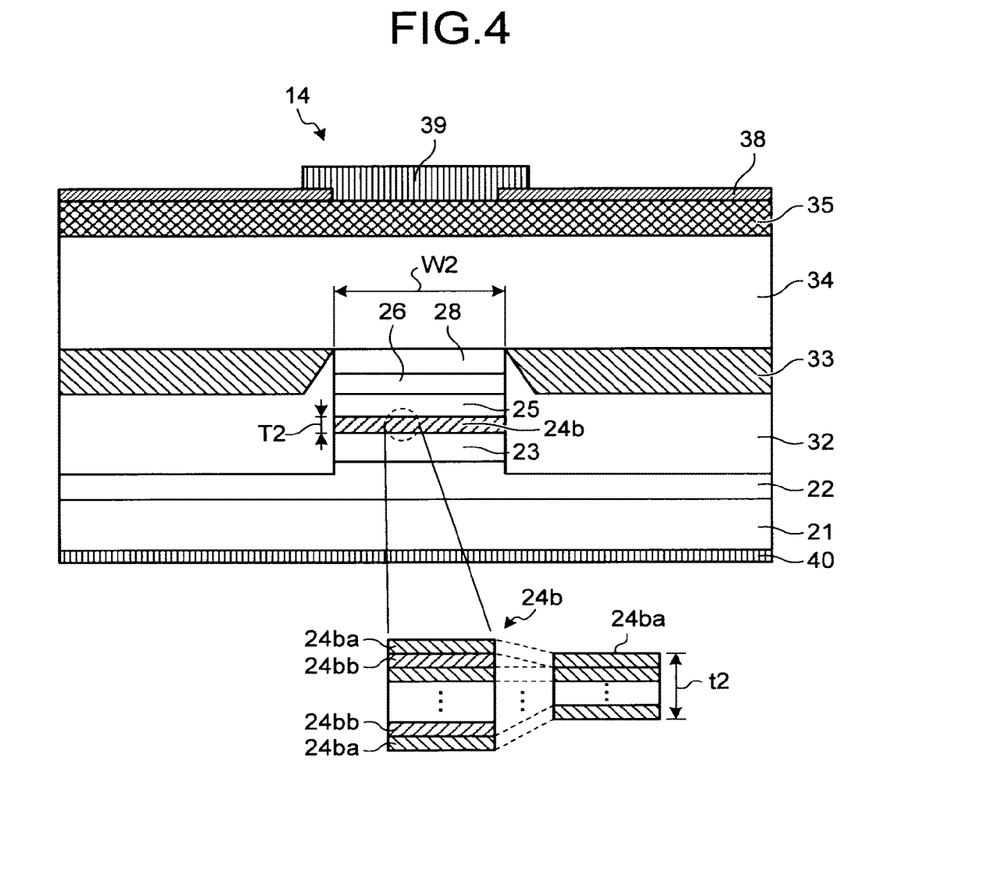
FIG. 4 is a cross-sectional view of the integrated semiconductor laser element cut along a line C-C shown in FIG. 1.

FIG. 4 is a cross-sectional view of the integrated semiconductor laser element 100 cut along a line C-C shown in FIG. 1. In FIG. 4, a portion of an active layer in the cross section cut along the line C-C is shown, indicating its layered structure. As shown in FIG. 4, the semiconductor optical amplifier 14 has a similar buried mesa structure as the DFB lasers 11-1 to 11-*n*. However, the semiconductor optical amplifier 14 has a structure in which the active layer 24*a* is replaced with an active layer 24*b*. Furthermore, the semiconductor optical amplifier 14 does not include the grating layer 27 formed of InGaAsP or AlGaInAs, but includes the p-type InP layer 28 formed instead. The active layer 24*b* has a thickness T2, and as shown in an enlarged cross section, includes a plurality of well layers 24*ba* and a plurality of barrier layers 24*bb* grown in an alternate manner. Both of the well layers 24*ba* and the barrier layers 24*bb* are formed of a GaInAsP-based semiconductor material or an AlGaInAs-based semiconductor material. The thickness T2 is a total thickness of the active layer 24*b* including the well layers 24*ba* and the barrier layers 24*bb*, and a thickness t2 is a total thickness of the well layers 24*ba* only. The composition of the active layer 24*b* is the same as the composition of the active layer 24*a* of each of the DFB lasers 11-1 to 11-*n*, with the same layered structure formed by the well layers and the barrier layers, and the thickness T2 is the same as the thickness T1. Therefore, as is described later, the active layer 24*a* and the active layer 24*b* can be manufactured in a single process. As for the width of the active layer 24*b*, in the same manner as the width of the mesa structure described above, the equal width portion 14*a* has the width W1, the expanded width portion 14*c* has the width W2 that is wider than the width W1, and the tapered portion 14*b* has a width that is expanded from the value of the width W1 to the value of the width W2 in a continuous manner. The width W1 is set to an optimum value for guiding light with a desired wavelength from the DFB lasers 11-1 to 11-*n* in a single mode. The width of the active layer 24*b* in the cross section cut along the line C-C shown in FIG. 4 is the width W2.

The spot size converter 15 is formed at the other end portion of the integrated semiconductor laser element 100 on the opposite side of the DFB lasers 11-1 to 11-*n*, and is optically coupled to a light output side of the semiconductor optical amplifier 14. The spot size converter 15 has a similar buried mesa structure as the optical coupler 13. However, the width of the spot size converter 15 is narrowed toward the light output side in a continuous manner.

An operation of the integrated semiconductor laser element 100 is explained next. First, a DFB laser selected from the DFB lasers 11-1 to 11-*n* is driven to output single-mode laser light with a desired wavelength. A separating resistance between the DFB lasers is large enough because the trench grooves 17-1 to 17-*m* electrically separate the DFB lasers 11-1 to 11-*n* from each other, respectively, and therefore it is possible to select and drive any one of the DFB lasers 11-1 to 11-*n* in an easy manner.

Next, an optical waveguide optically coupled to the driven DFB laser among the optical waveguides 12-1 to 12-*n* guides output light from the driven DFB laser in a single mode. The optical coupler 13 transmits the light guided through the optical waveguide and outputs the light from an output port 13*a*. The semiconductor optical amplifier 14 amplifies the light output from the output port 13*a* and outputs an amplified light to the spot size converter 15. The semiconductor optical amplifier 14 is used to make up for a loss of the output light from the driven DFB laser at the optical coupler 13, and to obtain an optical output of a desired intensity from an output end.

The output light from the optical coupler 13 includes a certain degree of amount of a light in a higher-order mode. However, because the semiconductor optical amplifier 14 includes the equal width portion 14*a* that guides the output light from the optical coupler 13 in a single mode, as described above, the light of the higher-order mode included in the output light is leaked to outside in a sufficient manner, and therefore amplification and output of the light of the higher-order mode to outside is suppressed. As a result, an occurrence of a kink in the I-L characteristic that indicates a relation between a driving current and optical output of the semiconductor optical amplifier 14 is suppressed. From this aspect, it is preferable to set the length L1 of the equal width portion 14*a* to be 100 μm or longer in order to sufficiently leak the light of the higher-order mode. Furthermore, in order that a semiconductor waveguide guides light in a single mode within a wavelength band of 1520 nm to 1620 nm, which is most typically used in DWDM optical communications, it is preferable to set the width W1 of the equal width portion 14*a* to be 1.5 μm to 3.5 μm.

Furthermore, the active layer 24*b* of the semiconductor optical amplifier 14 includes the expanded width portion 14*c*, and the width of the expanded width portion 14*c* is set according to the total thickness t2 of the well layers 24*ba* of the active layer 24*b*. As a result, the integrated semiconductor laser element 100 is configured such that the gain peak wavelength of the semiconductor optical amplifier 14 in an operating state substantially matches the gain peak wavelength of the semiconductor laser obtained by setting the composition of the active layer 24b even in a high-power operation condition.

The above aspect is explained below in detail. As described above, if an even higher-power output is achieved in the integrated semiconductor laser element having the conventional structure in which a DFB laser and a semiconductor optical amplifier share a common active layer, the wavelength dependency of the output intensity of the laser light changes, so that a deviation of the output intensity with respect to the wavelength is increased. Such a change of the wavelength dependency causes the gain peak wavelength to shift to the short wavelength side, that is, the high energy side. Therefore, it is considered that a cause of the change of the wavelength dependency is that, in the semiconductor optical amplifier, an increase of the current injection amount to obtain the high output power increases the carrier density in an operating state, leading to a band filling phenomenon. In the DFB laser, because the carrier density is clamped and kept constant in a laser oscillating state, it is considered that the band filling phenomenon does not occur.

Such a shift of the gain peak of the semiconductor optical amplifier can be compensated by setting the composition of the active layer of the semiconductor optical amplifier in advance such that the gain peak appears at a longer wavelength. However, in this case, if the composition of the active layer of the DFB laser is to be the same as the composition of the active layer of the semiconductor optical amplifier, the wavelength at which the threshold current of the DFB laser is minimized becomes also positioned at the long wavelength side according to the gain peak, and therefore the threshold current of the DFB laser of which the oscillation wavelength is at the short wavelength side increases, which is not desirable.

On the other hand, in the integrated semiconductor laser element 100, because the semiconductor optical amplifier 14 includes the expanded width portion 14c whose width is set according to the total thickness t2 of the well layers 24ba of the active layer 24b, an increase in the carrier density is suppressed even when the current injection amount is increased. As a result, it is possible to substantially match the gain peak wavelength of the semiconductor optical amplifier 14 in an operating state and the gain peak wavelength obtained by setting the composition. In addition, because the active layer 24a and the active layer 24b can be made with the same composition and the same thickness, it is possible to manufacture both in a single process.

When the carrier density is high, in a high temperature environment, the carriers may move to an area other than the well layers in the active layer exceeding the energy barrier by the thermal energy, or even with the carriers existing in the well layers, a proportion of carries consumed may be increased by an Auger recombination, resulting in a decrease of the gain of the semiconductor optical amplifier. However, in the integrated semiconductor laser element 100 according to the first embodiment, because the increase of the carrier density is suppressed, the gain of the semiconductor optical amplifier 14 is not decreased even in a high temperature environment of, for example, 50° C. or higher, which is suitable for an operation in the high temperature condition.

Finally, the spot size converter 15 guides input light and outputs the light from an output end 15a. Although a spot size of the light input to the spot size converter 15 is spread in the lateral direction because the light is propagated through the expanded width portion 14c of the semiconductor optical amplifier 14, the lateral spread of the spot size is narrowed by the spot size converter 15 and is converted into a substantially circular shape. Therefore, the light output from the output end 15a is coupled to an optical fiber and the like with high coupling efficiency, because the light of the higher-order mode is eliminated by the equal width portion 14a of the semiconductor optical amplifier 14 and the spot size is converted into a substantially circular shape by the spot size converter 15.

EXAMPLES AND COMPARATIVE EXAMPLES

Subsequently, the integrated semiconductor laser element 100 according to the first embodiment is explained in further detail using Examples and comparative examples. The example explained below is an experimental result showing a relation of the threshold current of the DFB laser and an optical output from the semiconductor optical amplifier with respect to the oscillation wavelength of the DFB laser when the well layers of the active layer are formed with a predetermined composition. In each of the Examples, the number of DFB lasers is 12, and the laser oscillation wavelengths are arranged at intervals of 3.5 nm or 4 nm from 1527 nm. The current (driving current) injected into the DFB lasers and the current (driving current) injected into the semiconductor optical amplifier are 150 mA and 200 mA, respectively, and the temperature of the element is 30° C.

Comparative Example 1

First, as a comparative example 1, an integrated semiconductor laser element 200 having the conventional structure shown in FIG. 15 was manufactured. This integrated semiconductor laser element and the integrated semiconductor laser element 100 shown in FIG. 1 share the same semiconductor layer structure, but are different in that the width of the active layer of the semiconductor optical amplifier is equally wide along the longitudinal direction. The width of the active layer of the semiconductor optical amplifier is 2 μm, and the length is 900 μm. The thickness of each of the well layers of the active layer of the DFB laser and the semiconductor optical amplifier is 6 nm, and the number of the well layers is six. Therefore, volume of total of the well layers of the active layer of the semiconductor optical amplifier (the total volume) is 64.8 μm$^3$. Furthermore, the composition of each active layer is set such that the optical output of the integrated semiconductor laser element is equal to or larger than 33 mW at each of the oscillation wavelengths of the DFB lasers, considering the shift of the gain peak in the operating state.

Figure 5:
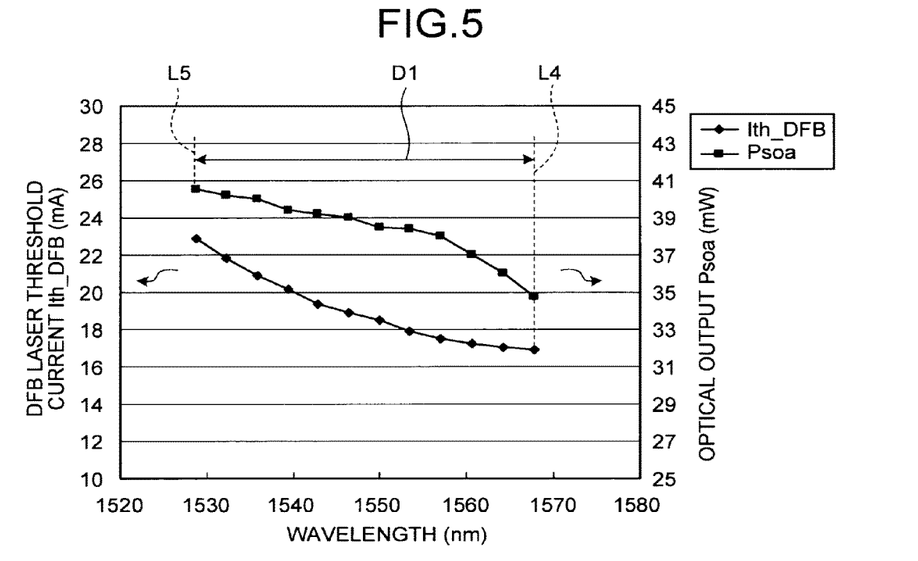
FIG. 5 is a graph of an example of the wavelength dependency of an optical output of an integrated semiconductor laser element according to a comparative example 1 and a threshold current of a DFB laser.

FIG. 5 is a graph of the wavelength dependency of an optical output Psoa of the integrated semiconductor laser element according to the comparative example 1 (an optical output when the driving current of the semiconductor optical amplifier is 200 mA, and the driving current of the DFB laser is 150 mA at a temperature of 30° C.) and a threshold current Ith_DFB of the DFB laser. The wavelength dependency of the optical output Psoa from the semiconductor optical amplifier corresponds to the wavelength dependency of the gain of the semiconductor optical amplifier in the operating state. The wavelength dependency of the Ith_DFB shows a characteristic opposite to the wavelength dependency of the gain due to the setting of the composition of the active layer, and a wavelength at which the Ith_DFB is minimized corresponds to a wavelength at which the gain is maximized. As shown in FIG. 5, in the integrated semiconductor laser element having the conventional structure, both the Ith_DFB and the Psoa have large deviations, which are 5.9 mA and 5.8 mW, respectively. Furthermore, a difference D1 between the wavelength at which the Ith_DFB takes the minimum value, which is indicated by a line L4, and the wavelength at which the Psoa takes the maximum value, which is indicated by a line L5, is as large as about 40 nm.

Example 1

Subsequently, as an Example 1, the integrated semiconductor laser element according to the first embodiment shown in FIG. 1 was manufactured. In the integrated semiconductor laser element according to the Example 1, as for the width of the active layer of the semiconductor optical amplifier, the width of the equal width portion is 1.5 µm, and the width of the expanded width portion is 4.0 µm. Furthermore, as for the length, the length of the equal width portion is 450 µm, the length of the tapered portion is 343 µm, and the length of the expanded width portion is 122 µm. The thickness of each of the well layers of the active layer of the DFB laser and the semiconductor optical amplifier is 6 nm, and the number of the well layers is seven. Therefore, the total volume of the well layers of the active layer of the semiconductor optical amplifier is 92.064 µm$^3$. The composition of each of the well layers is set such that the gain peak of the semiconductor laser is positioned on a shorter wavelength side than the case of the comparative example.

Figure 6:
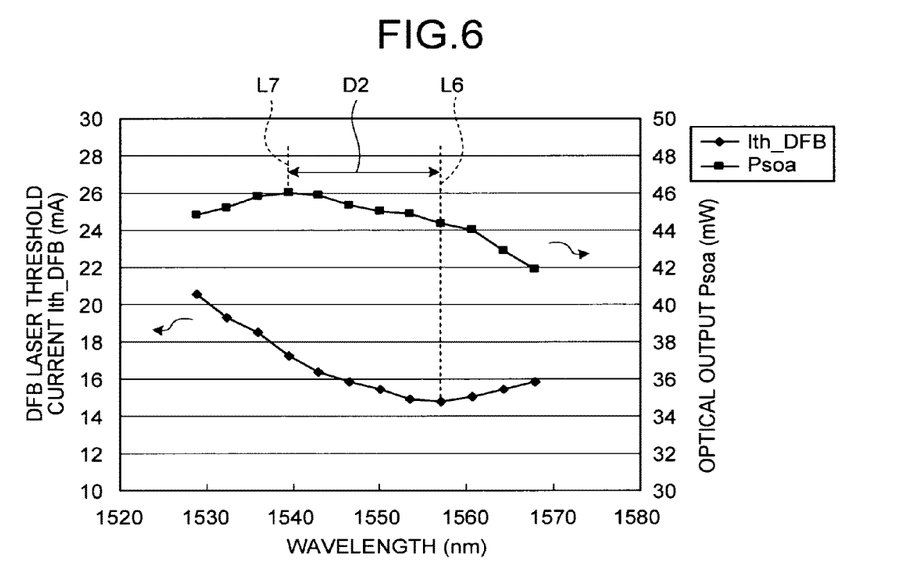
FIG. 6 is a graph of the wavelength dependency of an optical output of an integrated semiconductor laser element according to an Example 1 and a threshold current of a DFB laser.

FIG. 6 is a graph of an example of the wavelength dependency of the optical output Psoa of the integrated semiconductor laser element according to the Example 1 and the threshold current Ith_DFB of the DFB laser. As shown in FIG. 6, in the integrated semiconductor laser element according to the Example 1, deviations of the Ith_DFB and the Psoa are smaller than those in the comparative example, which are 5.7 mA and 4.1 mW, respectively. In addition, a difference D2 between the wavelength at which the Ith_DFB takes the minimum value, which is indicated by a line L6, and the wavelength at which the Psoa takes the maximum value, which is indicated by a line L7, is as small as 15 nm.

Example 2

Subsequently, as an Example 2, an integrated semiconductor laser element was manufactured with a thickness of the well layer of the active layer different from that of the Example 2. In the integrated semiconductor laser element according to the Example 2, the widths of the equal width portion and the expanded width portion and the lengths of the equal width portion, the tapered portion, and the expanded width portion of the active layer of the semiconductor optical amplifier are the same as those of the Example 1. The thickness of each of the well layers of the active layer of the DFB laser and the semiconductor optical amplifier is 7 nm, and the number of the well layers is seven. Therefore, the total volume of the well layers of the active layer of the semiconductor optical amplifier is 107.408 µm$^3$. The composition of each of the well layers is set such that the gain peak is positioned near the center of the wavelength band that is formed with the oscillation wavelengths of the DFB lasers.

Figure 7:
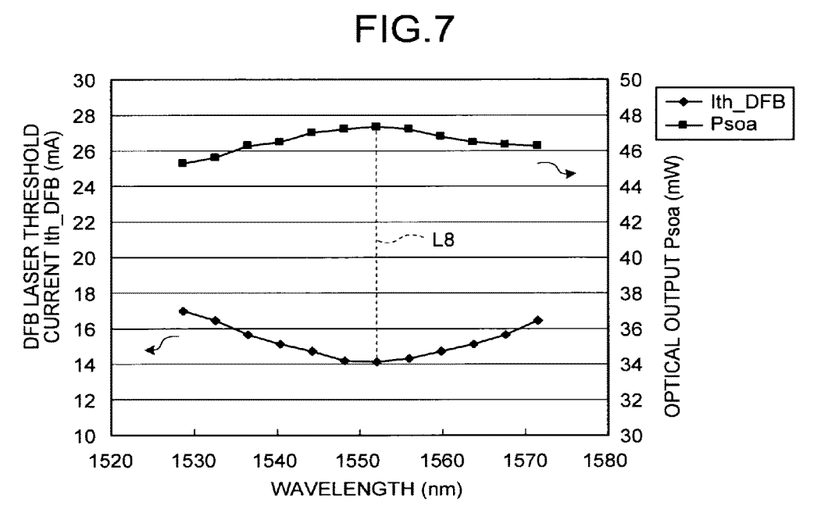
FIG. 7 is a graph of the wavelength dependency of an optical output of an integrated semiconductor laser element according to an Example 2 and a threshold current of a DFB laser.

FIG. 7 is a graph of an example of the wavelength dependency of the optical output Psoa of the integrated semiconductor laser element according to the Example 2 and the threshold current Ith_DFB of the DFB laser. As shown in FIG. 7, in the integrated semiconductor laser element according to the Example 2, deviations of the Ith_DFB and the Psoa are even smaller than those of the Example 1, which are 2.8 mA and 2 mW, respectively. In addition, the wavelength at which the Ith_DFB takes the minimum value matches the wavelength at which the Psoa takes the maximum value, as is indicated by a line L8.

It is desirable that the wavelength at which the Ith_DFB is minimized and the wavelength at which the Psoa is maximized, that is, the gain peak wavelength obtained by setting the composition of the well layers and the gain peak wavelength in the operating state match each other in a complete manner. However, considering that a wavelength range of 40 nm, for example, from 1530 nm to 1570 nm, from 1570 nm to 1610 nm, or the like is most widely used as an output wavelength range of the integrated semiconductor laser element in DWDM optical communications, it is sufficient that a difference between the gain peak wavelength of the semiconductor laser obtained by setting the composition and the gain peak wavelength of the semiconductor optical amplifier in the operating state be within a range of ±15 nm. This preferable range is based on a change amount of a curve of the optical output Psoa. Generally, when parameters set in a structure similar to the present case are used, if the wavelength is away from the peak of the Psoa by about 30 nm, the output of Psoa becomes considerably changed. For example, as shown in FIG. 6, referring to an optical output curve having the peak near a wavelength of 1540 nm, 5% of output change is shown at a wavelength of 1560 nm that is away from the peak wavelength by 20 nm, and 10% of output change is shown at a wavelength of 1570 nm that is away from the peak wavelength by 30 nm. Comparing the results of the output changes at the wavelengths of 1560 nm and 1570 nm, although there is only 5% of output change in a range of 20 nm from the peak wavelength, if the wavelength is farther away from the peak wavelength by 10 nm, a shift of only 10 nm causes 5% of output change that is the same proportion as the shift of 20 nm. If the wavelength is even farther away from the peak wavelength, it can be estimated that the change of the optical output will be a level that is not acceptable. Therefore, in order to prevent the wavelength at which the optical output is decreased to a level that is not acceptable from occurring within an operation wavelength range, it is important to set the difference between the gain peak wavelength of the semiconductor laser obtained by setting the composition and the gain peak wavelength of the semiconductor optical amplifier in the operating state within a range of ±15 nm, and more preferably, within a range of ±10 nm. The difference between the gain peak wavelength of the semiconductor laser obtained by setting the composition and the gain peak wavelength of the semiconductor optical amplifier in the operating state can be arbitrarily adjusted by setting the width of the expanded width portion according to the total thickness of the well layers of the active layer.

It is preferable to set the total thickness of the well layers to be 45 nm or thicker as is the case in the Example 2, and it is preferable to set the total thickness to be thinner than about 70 nm, which can be easily manufactured from the aspect of layer strain. In addition, the width of the expanded width portion of the active layer of the semiconductor optical amplifier is set according to the total thickness of the well layers. It is preferable to set the width of the expanded width portion to be about for example, as is the case in the Example 2. Furthermore, it is preferable that the volume of the semiconductor optical amplifier be set to be 100 µm$^3$ or larger.

Examples 3 to 5

Subsequently, as an Example 3 to an Example 5, the integrated semiconductor laser element 100 similar to that according to the Example 1 was manufactured. The Examples 3 to 5 are different from the Example 1 in that the width of the equal width portion of the semiconductor optical amplifier is 2 μm. Furthermore, as for the length of the equal width portion, the Example 3 takes 600 μm that is longer than the Example 1, the Example 4 takes 450 μm that is the same value as in the Example 1, and the Example 5 takes 100 μm that is shorter than the Example 1. When the same experiment as the Example 1 described above (the experiment on the relation between the threshold current of the DFB laser and the optical output from the semiconductor optical amplifier) was performed on the Examples 3 to 5, the deviations of both the threshold current and the optical output were as small as those of the Example 1.

Figure 8:
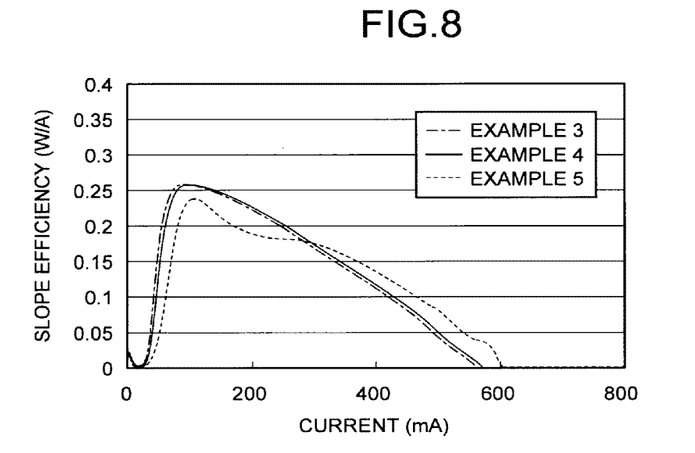
FIG. 8 is a graph of a relation between a driving current of a semiconductor optical amplifier in an integrated semiconductor laser element according to Examples 3 to 5 and a slope efficiency for an optical output.

FIG. 8 is a graph of a relation between the driving current of the semiconductor optical amplifier 14 in the integrated semiconductor laser element 100 according to the Examples 3 to 5 and a slope efficiency for the optical output Psoa. The DFB laser is driven with the driving current of 150 mA. As shown in FIG. 8, curves indicating the slope efficiency show smooth shapes in the Examples 3 and 4 with no kinks. On the other hand, a slight kink is shown in the Example 5.

As explained above, the integrated semiconductor laser element 100 according to the first embodiment is suitable for an operation in a high temperature condition, a high output power is achieved, and an increase of the deviation of the output intensity with respect to the wavelength is suppressed.

(Manufacturing Method)

An example of a method of manufacturing the integrated semiconductor laser element 100 according to the first embodiment is explained below. FIGS. 9 to 12 are explanatory diagrams for explaining the method of manufacturing the integrated semiconductor laser element 100 shown in FIG. 1. FIGS. 9 to 12 are cross-sectional views of the integrated semiconductor laser element 100 cut along a line D-D (see FIG. 1) in each manufacturing process.

Figure 9:
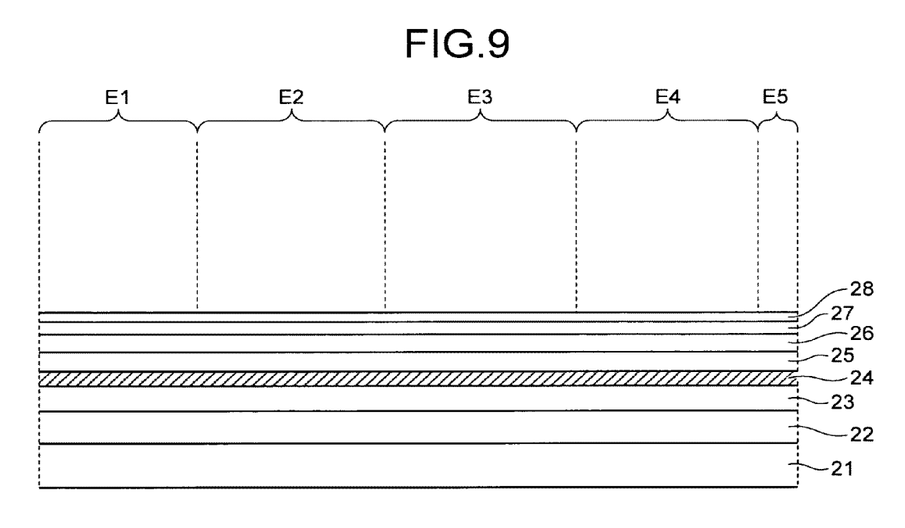
FIG. 9 is an explanatory diagram for explaining a method of manufacturing the integrated semiconductor laser element shown in FIG. 1.

First, as shown in FIG. 9, the n-type InP buffer layer 22, the lower InGaAsP-SCH layer 23, an active layer 24, the upper InGaAsP-SCH layer 25, the InP spacer layer 26, the grating layer 27, and the p-type InP layer 28 are sequentially grown on the n-type InP substrate 21 by using, for example, the metal organic chemical vapor deposition (MOCVD) method. Areas E1 to E5 in the drawing indicate an area for forming the DFB lasers 11-1 to 11-n, an area for forming the optical waveguides 12-1 to 12-n, an area for forming the optical coupler 13, an area for forming the semiconductor optical amplifier 14, and an area for forming the spot size converter 15, respectively.

Subsequently, after depositing a SiN film on the entire surface, patterning is performed to form grating patterns with different pitches from each other at positions where the DFB lasers 11-1 to 11-n are formed, respectively, in the area E1. Patterning is also performed in the area E4. By performing etching with the SiN film as a mask, grating grooves that become the grating are formed on the grating layer 27 in the area E1, and the grating layer 27 in the area E4 is removed. Thereafter, after removing the mask of the SiN film, the p-type InP layer 28 is regrown on the entire surface of the areas E1 to E5.

Figure 10:
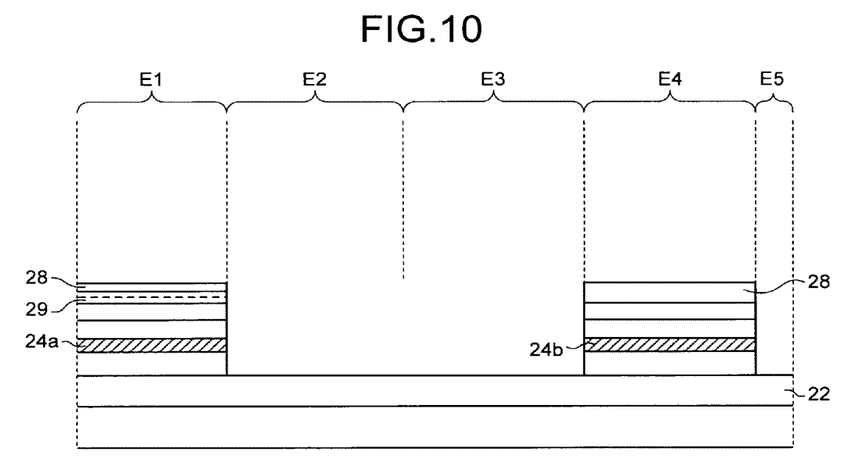
FIG. 10 is an explanatory diagram for explaining the method of manufacturing the integrated semiconductor laser element shown in FIG. 1.

Subsequently, after depositing a SiN film on the entire surface, patterning is performed to form a pattern that is slightly wider than the DFB laser and the semiconductor optical amplifier in the areas E1 and E4, respectively. By performing etching with the SiN film as a mask, as shown in FIG. 10, the n-type InP buffer layer 22 is exposed by removing the layers up to the lower InGaAsP-SCH layer 23. At this time, in the areas E2, E3, and E5, all the layers up to the lower InGaAsP-SCH layer 23 is removed. With this process, the active layers 24a and 24b having the same composition, the same thickness, and the same structure are formed from the active layer 24 formed by the process shown in FIG. 9. Reference sign 29 denotes grating grooves.

Figure 11:
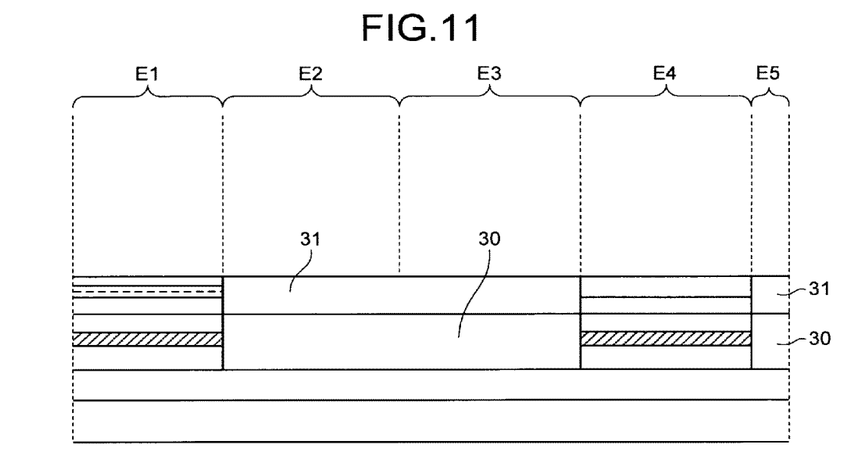
FIG. 11 is an explanatory diagram for explaining the method of manufacturing the integrated semiconductor laser element shown in FIG. 1.

Thereafter, the InGaAsP core layer 30 and the i-type InP layer 31 are sequentially grown, as shown in FIG. 11, by the MOCVD method using the mask of the SiN film as it is as a mask for a selective growth.

Subsequently, after removing the mask of the SiN film, a new SiN film is deposited, and patterning is performed to form a pattern corresponding to the DFB lasers 11-1 to 11-n, the optical waveguides 12-1 to 12-n, the optical coupler 13, the semiconductor optical amplifier 14, and the spot size converter 15 shown in FIG. 1. Etching is performed with the SiN film as a mask to form mesa structures corresponding to the DFB lasers 11-1 to 11-n, the optical waveguides 12-1 to 12-n, the optical coupler 13, the semiconductor optical amplifier 14, and the spot size converter 15, and at the same time, the n-type InP buffer layer 22 is exposed.

Figure 12:
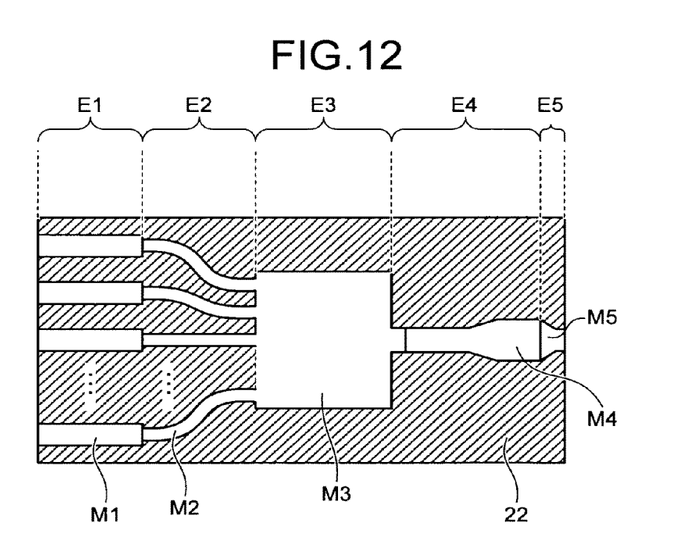
FIG. 12 is an explanatory diagram for explaining the method of manufacturing the integrated semiconductor laser element shown in FIG. 1.

FIG. 12 is a schematic plan view of a state after performing the above process. Mesa structures M1 to M5 having configurations corresponding to the DFB lasers 11-1 to 11-n, the optical waveguides 12-1 to 12-n, the optical coupler 13, the semiconductor optical amplifier 14, and the spot size converter 15 are formed in the areas E1 to E5, respectively. The n-type InP buffer layer 22 is in a state of being exposed.

Thereafter, the p-type InP embedding layer 32 and the n-type InP current blocking layer 33 are sequentially grown on the exposed n-type InP buffer layer 22 by the MOCVD method using the mask of the SiN film used at the last process, as a mask for a selective growth. Subsequently, after removing the mask of the SiN film, the p-type InP cladding layer 34 and the InGaAs contact layer 35 are sequentially grown on the entire surface of the areas E1 to E5 by the MOCVD method.

Thereafter, after depositing a SiN film on the entire surface, patterning is performed to form a pattern corresponding to the trench grooves 17-1 to 17-m. Etching is then performed using the SiN film as a mask to form the trench grooves 17-1 to 17-m. The trench grooves 17-1 to 17-m are formed until a depth that reaches the n-type InP buffer layer 22, and it is sufficient to form the trench grooves 17-1 to 17-m until a depth that can electrically separate the DFB lasers 11-1 to 11-n from each other.

Subsequently, after removing the mask of the SiN film, a SiN film is deposited again on the entire surface, the SiN protective film 38 is formed by forming openings for the DFB lasers 11-1 to 11-n and the semiconductor optical amplifier 14, and after depositing a two-layer conductive film consisting of AuZn/Au on the entire surface, the p-side electrode 39 is formed by performing patterning to make shapes corresponding to the DFB lasers 11-1 to 11-n and the semiconductor optical amplifier 14. The n-side electrode 40 having a two-layer structure consisting of AuGeNi/Au is formed on the rear surface of the n-type InP substrate 21. With this process, the DFB lasers 11-1 to 11-n, the optical waveguides 12-1 to 12-n, the optical coupler 13, the semiconductor optical amplifier 14, and the spot size converter 15 are formed.

Finally, the n-type InP substrate 21 is cleaved in a bar shape in which a plurality of integrated semiconductor laser elements 100 is arranged, and after coating an antireflection film on end facets on which the DFB lasers 11-1 to 11-n and the semiconductor optical amplifier 14 are respectively formed, the integrated semiconductor laser elements 100 are separated from one another, and thus the integrated semiconductor laser element 100 is completed.

Although the DFB laser is used as the semiconductor laser in the above embodiment, it is not particularly limited as long as it is a semiconductor laser that oscillates in a single mode. For example, a DBR (Distributed Bragg Reflector) laser, a TDA (Tunable Distributed Amplification)-DFB laser, and the like can be used. Furthermore, as for the optical coupler, for example, a fresnel coupler or a multimode interference-type optical coupler may be used. In addition, as for the semiconductor material of the integrated semiconductor laser element, although an InP-based semiconductor material and the like are used in the above embodiment to use a wavelength near 1550 nm, the semiconductor material can be arbitrarily selected and used according to the wavelength to be used.

Second Embodiment

A second embodiment of the present invention is explained next. A semiconductor laser module according to the second embodiment is a full-band tunable laser module using the integrated semiconductor laser element according to the first embodiment, which is compliant with the standard of the integrable tunable laser assembly (ITLA).

Figure 13:
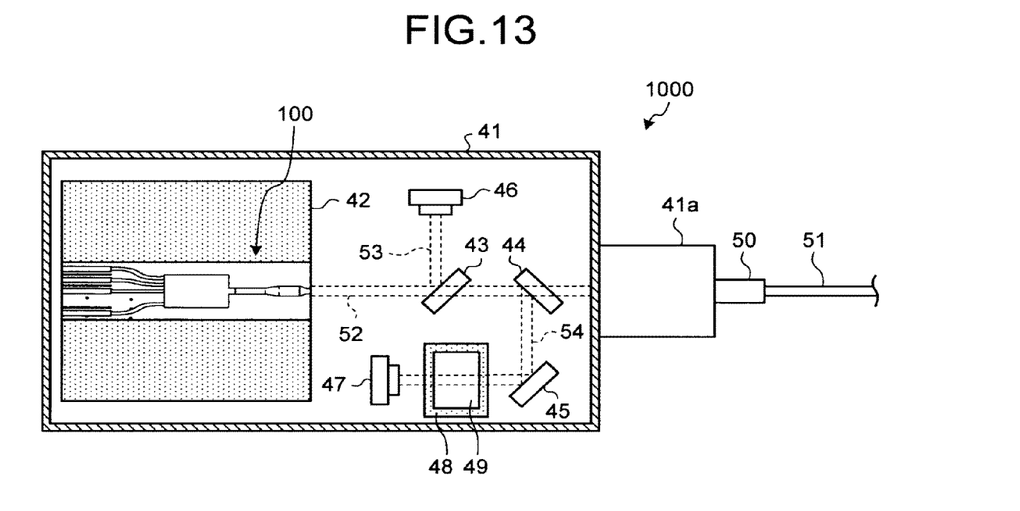
FIG. 13 is a schematic plan view of a semiconductor laser module according to a second embodiment of the present invention.

FIG. 13 is a schematic plan view of the semiconductor laser module according to the second embodiment. In FIG. 13, an internal structure of the laser module is shown by cutting a top portion of a casing, for the sake of explanation. As shown in FIG. 13, a semiconductor laser module 1000 includes a casing 41, the integrated semiconductor laser element 100 according to the first embodiment shown in FIG. 1, Peltier elements (TECs) 42 and 48 that are thermoelectric devices, mirrors 43, 44, and 45, photodiodes (PDs) 46 and 47, an etalon filter 49, a ferrule 50 that is accommodated in a protruding portion 41a of the casing 41, and a polarization-maintaining optical fiber 51 that is connected to the ferrule 50. A control circuit, a lens, and the like (not shown) are also accommodated in the casing 41.

The integrated semiconductor laser element 100 is disposed on the TEC 42. The number of DFB lasers arranged in an array in the integrated semiconductor laser element 100 is 12. An interval of the oscillation wavelengths of the DFB lasers is 3.5 nm, and each of the oscillation wavelengths is set to be a desired wavelength near the ITU grid defined by the International Telecommunication Union (ITU). A desired DFB laser is selected and driven by an external driving current, and the oscillation wavelength is adjusted by controlling the temperature of the integrated semiconductor laser element 100 within a range from 10° C. to 50° C. by the TEC 42, by which it is possible to output a laser light that covers the whole wavelength grid in a full-band of a C-band or an L-band used in an optical fiber transmission.

Furthermore, the semiconductor laser module 1000 has incorporated therein a wavelength locking mechanism for compensating a drift of the oscillation wavelength due to a temporal change of the DFB laser. This wavelength locking mechanism has a known structure using the mirrors 43, 44, and 45, the PDs 46 and 47, and the etalon filter 49.

The wavelength locking mechanism operates as follows. A laser light 52 output from the integrated semiconductor laser element 100 is collimated by a collimator lens (not shown). The mirror 43 transmits the laser light 52, and reflects a part of the laser light 52. The PD 46 detects a reflected laser light 53, and outputs a current of a magnitude corresponding to its detection intensity.

The mirror 44 further transmits the laser light 52 passed through the mirror 43, and reflects a part of the laser light 52. The laser light 52 passed through the mirror 44 is coupled to the optical fiber 51 by a focusing lens that is not shown in the drawing and output to outside through the optical fiber 51. On the other hand, the mirror 45 further reflects a reflected laser light 54, the etalon filter 49 transmits the reflected laser light 54, and the PD 47 detects the laser light 54 passed through the etalon filter 49 and outputs a current of a magnitude corresponding to its detection intensity.

The etalon filter 49 is placed on the TEC 48, and its temperature is controlled such that a transmission wavelength matches a wavelength of the ITU grid. Therefore, the intensity of the laser light 54 that passes through the etalon filter 49 decreases if the wavelength of the laser light 54 is shifted from the wavelength of the ITU grid. Based on this point, in the wavelength locking mechanism, a decrease of the output current value of the PD 47 with respect to the output current value of the PD 46 is detected as a shift of the wavelength, and the temperature of the integrated semiconductor laser element 100 is adjusted by feedback controlling the TEC 42 based on the output current value of the PD 47, by which the wavelength of the laser light 52 from the integrated semiconductor laser element 100 is locked to a desired wavelength.

Two TECs 42 and 48 are incorporated in the semiconductor laser module 1000, with which it is possible to control the temperature of the integrated semiconductor laser element 100 and the temperature of the etalon filter 49 in an independent manner. When only the temperature control of the semiconductor laser element is performed with one TEC, as is the case in the conventional semiconductor laser module, the temperature of the etalon filter varies, leading to a state where a wavelength drift easily occurs, and therefore it is hard to control the laser module or to manufacture the module. On the other hand, because the semiconductor laser module 1000 takes a module structure that can control the laser element and the etalon filter with two TECs in an independent manner, the wavelength controllability of the output laser light is enhanced.

The semiconductor laser module 1000 according to the second embodiment can perform a high-power operation, and therefore a stable operation can be achieved regardless of heat generation because the temperature control can be performed on the semiconductor laser element and the etalon filter in an independent manner. Furthermore, because the semiconductor laser module 1000 can perform a stable operation at a high output power, characteristics in terms of noise are also excellent, such as the spectral linewidth and the RIN (Relative Intensity Noise), which satisfies the specification of the ITLA-MSA (Multi-Source Agreement). In addition, because the semiconductor laser module 1000 covers the full-band of the C-band or the L-band, it is possible to realize a wavelength locking corresponding to the DWDM with an interval of 50 Gigahertz. Therefore, the semiconductor laser module 1000 is suitable for the DWDM communication system. Further, because the semiconductor laser module 1000 can realize a stable high-power output, it can be applied to an optical transceiver with the DWDM transmission specification that achieves a data rate of 100 gigabits per second or other communication systems that require a long-haul transmission.

Third Embodiment

Figure 14:
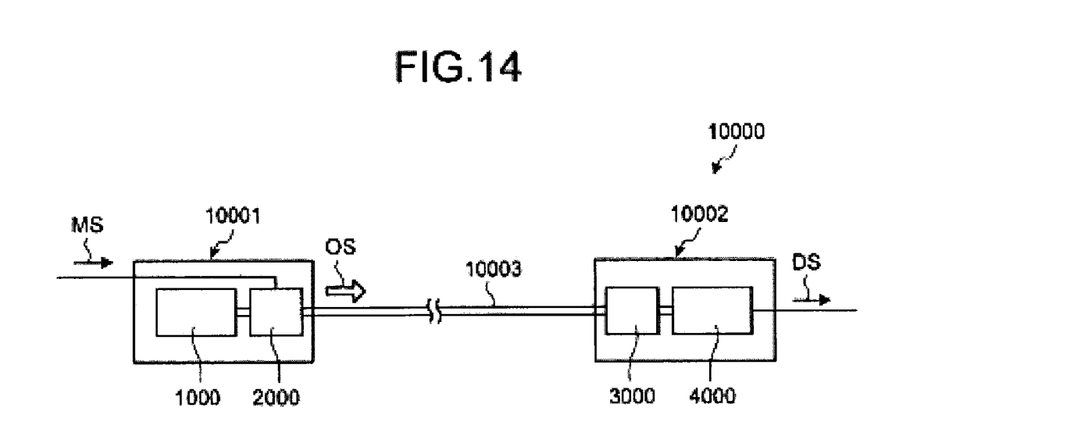
FIG. 14 is a block diagram of a configuration of an optical transmission system according to a third embodiment of the present invention.

FIG. 14 is a block diagram of a configuration of an optical transmission system according to a third embodiment. The optical transmission system 10000 is configured by connecting an optical transmitter 10001 and an optical receiver 10002 with an optical transmission line 10003 using an optical fiber cable. An optical repeater can be arranged in the middle of the optical transmission line 10003 as necessary.

The optical transmitter 10001 includes the semiconductor laser module 1000 according to the second embodiment and an optical modulator 2000 that is an external modulator connected to the semiconductor laser module 1000.

Furthermore, the optical receiver 10002 includes a light receiving element 3000 such as a PD, and a demodulator 4000 that is connected to the light receiving element 3000.

An operation of the optical transmission system 10000 is explained next. First, in the optical transmitter 10001, the semiconductor laser module 1000 outputs a laser light of a predetermined wavelength, and then the optical modulator 2000 receives the laser light. A modulation signal MS that uses a multivalue modulation system such as the 16QAM supplied from outside is applied to the optical modulator 2000. The optical modulator 2000 then applies multivalue modulation on the received laser light based on the modulation signal MS, and outputs a modulated laser light to the optical transmission line 10003 as an optical signal OS.

In the optical receiver 10002, the light receiving element 3000 receives the optical signal OS transmitted through the optical transmission line 10003, converts the optical signal OS into an electrical signal, and outputs the electrical signal. The demodulator 4000, which is configured to perform demodulation corresponding to the modulation system of the modulation signal MS by using an electrical amplifier, a waveform shaping unit, and the like, demodulates the electrical signal output from the light receiving element 3000, and outputs a demodulated signal DS.

As described above, because the semiconductor laser module 1000 is capable of performing a high-power operation, a sufficiently high intensity of a signal is maintained even when the signal is modulated with such a multivalue modulation signal in the optical transmitter 10001. As a result, it is possible to perform an optical transmission with a low error rate, enabling to achieve an optical transmission with a data rate of 100 gigabits per second, for example.

According to the embodiments of the present invention, it is possible to provide a high-power integrated semiconductor laser element which is suitable for an operation in a high temperature condition and in which an increase in a deviation of the output intensity with respect to a wavelength is suppressed, a semiconductor laser module, and an optical transmission system.

As described above, the integrated semiconductor laser element, the semiconductor laser module, and the optical transmission system according to the present invention are preferable to be used in DWDM optical communications.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An integrated semiconductor laser element comprising:
a plurality of semiconductor lasers that oscillate at different oscillation wavelengths from one another, each of the semiconductor lasers oscillating in a single mode;
an optical coupler that couples output light from the semiconductor lasers; and
a semiconductor optical amplifier that amplifies output light from the optical coupler, wherein
active layers of the semiconductor lasers and an active layer of the semiconductor optical amplifier have a same thickness and a same composition that is set to have a gain peak wavelength near a center of a wavelength band formed by the oscillation wavelengths of the semiconductor lasers,
the semiconductor optical amplifier includes an equal width portion formed on a side of the optical coupler to guide the output light in a single mode, an expanded width portion which is formed on a light output side and has a width wider than a width of the equal width portion, and a tapered portion between the equal width portion and the expanded width portion,
the total volume of well layers of the active layer of the semiconductor optical amplifier is equal to or greater than 100 $\mu m^3$,
an electric current injected into the semiconductor optical amplifier is equal to or greater than 200 mA, and
the width of the expanded width portion is set based on a total thickness of well layers of the active layer of the semiconductor optical amplifier such that a gain peak wavelength of the semiconductor optical amplifier in an operating state substantially matches the gain peak wavelength of the semiconductor lasers.

2. The integrated semiconductor laser element according to claim 1, wherein at least one of the active layers of the semiconductor lasers and the active layer of the semiconductor optical amplifier are formed by a same crystal growth process.

3. The integrated semiconductor laser element according to claim 1, wherein the equal width portion and the expanded width portion are coupled to each other via the tapered portion.

4. The integrated semiconductor laser element according to claim 1, wherein a deviation between the gain peak wavelength in the operating state and the gain peak wavelength of the semiconductor lasers that is obtained by the setting of the composition is within a range of ±15 nm.

5. The integrated semiconductor laser element according to claim 1, wherein a deviation between the gain peak wavelength in the operating state and the gain peak wavelength of the semiconductor lasers that is obtained by the setting of the composition is within a range of ±10 nm.

6. The integrated semiconductor laser element according to claim 4, wherein
a wavelength range of the output light from the semiconductor lasers is a 40-nm range selected from 1520 nm to 1620 nm, and the width of the expanded width portion is set such that the total volume of the well layers of the active layer of the semiconductor optical amplifier is equal to or larger than 1.42 times the total volume with which the deviation of the gain peak is 40 nm.

7. The integrated semiconductor laser element according to claim 5, wherein
a wavelength range of the output light from the semiconductor lasers is a 40-nm range selected from 1520 nm to 1620 nm, and
the width of the expanded width portion is set such that the total volume of the well layers of the active layer of the semiconductor optical amplifier is equal to or larger than 1.66 times the total volume with which the deviation of the gain peak is 40 nm.

8. The integrated semiconductor laser element according to claim 7, wherein the total thickness of the well layers of the active layer of the semiconductor optical amplifier is equal to or thicker than 45 nm.

9. The integrated semiconductor laser element according to claim 1, wherein length of the equal width portion of the active layer of the semiconductor optical amplifier is longer than 100 µm.

10. The integrated semiconductor laser element according to claim 1, wherein the optical coupler is a multimode interference-type optical coupler.

11. The integrated semiconductor laser element according to claim 1, further comprising a spot size converter that narrows a spot size of output light from the semiconductor optical amplifier.

12. A semiconductor laser module comprising the integrated semiconductor laser element according to claim 1.

13. An optical transmission system comprising the semiconductor laser module according to claim 12, wherein a data rate of 100 Gbps is achieved.

14. The integrated semiconductor laser element according to claim 1, wherein a width of an equal width portion of the active layer of the semiconductor optical amplifier is 1.5 μm to 3.5 μm.

* * * * *